US011515203B2

(12) United States Patent
Lu et al.

(10) Patent No.: US 11,515,203 B2
(45) Date of Patent: Nov. 29, 2022

(54) SELECTIVE DEPOSITION OF CONDUCTIVE CAP FOR FULLY-ALIGNED-VIA (FAV)

(71) Applicant: Tokyo Electron Limited, Tokyo (JP)

(72) Inventors: Yen-Tien Lu, Albany, NY (US); Kai-Hung Yu, Albany, NY (US); Xinghua Sun, Albany, NY (US); Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 52 days.

(21) Appl. No.: 16/782,344

(22) Filed: Feb. 5, 2020

(65) Prior Publication Data

US 2021/0242074 A1    Aug. 5, 2021

(51) Int. Cl.
*H01L 21/768* (2006.01)
*H01L 21/02* (2006.01)
*H01L 21/67* (2006.01)
*H01L 21/311* (2006.01)

(52) U.S. Cl.
CPC .... *H01L 21/7685* (2013.01); *H01L 21/02126* (2013.01); *H01L 21/02167* (2013.01); *H01L 21/02178* (2013.01); *H01L 21/31116* (2013.01); *H01L 21/67069* (2013.01); *H01L 21/76802* (2013.01); *H01L 21/76877* (2013.01); *H01L 21/76897* (2013.01)

(58) Field of Classification Search
CPC ........... H01L 21/7685; H01L 21/76802; H01L 21/76829; H01L 21/76831; H01L 21/76897; H01L 21/76877; H01L 21/76879
See application file for complete search history.

(56) References Cited

U.S. PATENT DOCUMENTS

| 9,576,901 B1 * | 2/2017 | Chen ................. H01L 21/76843 |
| 10,395,986 B1 | 8/2019 | Briggs et al. |
| 2003/0148618 A1 * | 8/2003 | Parikh ............... H01L 21/76849 438/694 |
| 2006/0118962 A1 * | 6/2006 | Huang .............. H01L 21/76838 257/760 |

(Continued)

OTHER PUBLICATIONS

Korean Intellectual Property Office, The International Search Report and the Written Opinion for International application No. PCT/US2021/016556, dated May 31, 2021, 11 pg.

*Primary Examiner* — Bac H Au
(74) *Attorney, Agent, or Firm* — Slater Matsil, LLP

(57) ABSTRACT

Methods and systems for selective deposition of conductive a cap for FAV features are described. In an embodiment, a method may include receiving a substrate having an interlayer dielectrics (ILD) layer, the ILD layer having a recess, the recess having a conductive layer formed therein, the conductive layer comprising a first conductive material. Additionally, such a method may include forming a cap within a region defined by the recess and in contact with a surface of the conductive layer, the cap comprising a second conductive material. The method may also include forming a conformal etch stop layer in contact with a surface of the cap and in contact with a region of the ILD layer. Further, the method may include selectively etching the etch stop layer using a plasma etch process, wherein the plasma etch process removes the etch stop layer selective to the second conductive material comprising the cap.

20 Claims, 7 Drawing Sheets

(56) References Cited

U.S. PATENT DOCUMENTS

| | | | |
|---|---|---|---|
| 2012/0077347 A1* | 3/2012 | Metz | H01J 37/32082 |
| | | | 438/715 |
| 2015/0171007 A1 | 6/2015 | Huang et al. | |
| 2015/0364371 A1* | 12/2015 | Yen | H01L 21/76805 |
| | | | 257/401 |
| 2017/0110336 A1* | 4/2017 | Hsu | H01L 21/76802 |
| 2017/0110397 A1* | 4/2017 | Wu | H01L 21/02126 |
| 2017/0207121 A1* | 7/2017 | Anderson | H01L 23/53238 |
| 2017/0317205 A1* | 11/2017 | Lee | H01L 21/02532 |
| 2018/0204797 A1 | 7/2018 | Lin et al. | |
| 2019/0295890 A1 | 9/2019 | Clark et al. | |
| 2020/0006140 A1 | 1/2020 | Tapily et al. | |
| 2020/0058593 A1* | 2/2020 | Kelly | H01L 21/288 |
| 2020/0144103 A1* | 5/2020 | Kim | H01L 21/76829 |
| 2021/0082802 A1* | 3/2021 | Huang | H01L 21/76856 |
| 2021/0143062 A1* | 5/2021 | Lanzillo | H01L 21/76885 |
| 2021/0193584 A1* | 6/2021 | LiCausi | G11C 5/06 |

* cited by examiner

SELECTIVE DEPOSITION OF CONDUCTIVE CAP FOR FULLY-ALIGNED-VIA (FAV)

BACKGROUND OF THE INVENTION

Field of Invention

The present invention relates to systems and methods for selective deposition of a conductive cap for fully-aligned-via (FAV) features.

Description of Related Art

Semiconductor device fabrication involves formation of physical features in one or more stacked layers of material on a semiconductor substrate. One type of semiconductor substrate is silicon (Si). Features may be formed to create electronic devices, such as integrated circuits. Such features may include transistor components, p-n junctions, and other components designed to produce an electrical effect in the integrated circuit. Such components are connected together by conductive lines.

In some integrated circuits, multiple layers or levels of circuitry may be formed. The layers may be interconnected using conductive features commonly referred to as vias. A via may be formed by etching a trench in one or more layers of the semiconductor or insulator material, and filling the trench with a conductive material, such as metal. The via may be formed in a trench of an upper layer such that the via comes in contact with an underlying conductive layer, such as a conductive line or interconnect element.

The conductive material used for vias is often deposited using rough deposition processes, such as sputtering or other physical layer deposition (PLD) processes. In other cases, chemical vapor deposition (CVD) processes may be used.

The process for forming the vias may include forming a series of one or more layers over a device level that contains one or more conductive elements. The overlying layers may be patterned using a photolithography process. A trench may be formed in the overlying layers down to the conductive layer. Although exactness in etch depth is ideal, in reality it is often difficult or impossible to etch the trenches to an exact depth. Consequently, the underlying device layer, including the conductive elements may be damaged. Furthermore, the conductive material from the damaged conductive elements may contaminate the work piece and the etch chamber. Such results are common, even when an etch stop layer, such as SiCN, SiOC, AlN, AlO, or the like is used. Additionally, residue from the etch stop layer material may further contaminate the workpiece and the chamber. Further examples of this issue are described below with reference to FIGS. 3A-3F. These issues in manufacturing degrade wafer yield results, and can contaminate the processing chamber causing a process shift, which is undesirable.

SUMMARY OF THE INVENTION

Methods and systems for selective deposition of a conductive cap for FAV features are described. In an embodiment, a method may include receiving a substrate having an interlayer dielectrics (ILD) layer, the ILD layer having a recess, the recess having a conductive layer formed therein, the conductive layer comprising a first conductive material. Additionally, such a method may include forming a cap within a region defined by the recess and in contact with a surface of the conductive layer, the cap comprising a second conductive material. The method may also include forming a conformal etch stop layer in contact with a surface of the cap and in contact with a region of the ILD layer. Further, the method may include selectively etching the etch stop layer using a plasma etch process, wherein the plasma etch process removes the etch stop layer selective to the second conductive material comprising the cap.

In an embodiment, a system for selective deposition of a conductive cap for FAV features may include a processing chamber configured to receive the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer. Additionally, such a system may include a controller coupled to the processing chamber and configured to control operations of the processing chamber to cause the processing chamber to: form a patterned recess in the multi-line layer to expose at least a first component of the multi-line layer and a second component of the multi-line layer, and etch the first component with a non-corrosive etch process that is selective to the second component.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
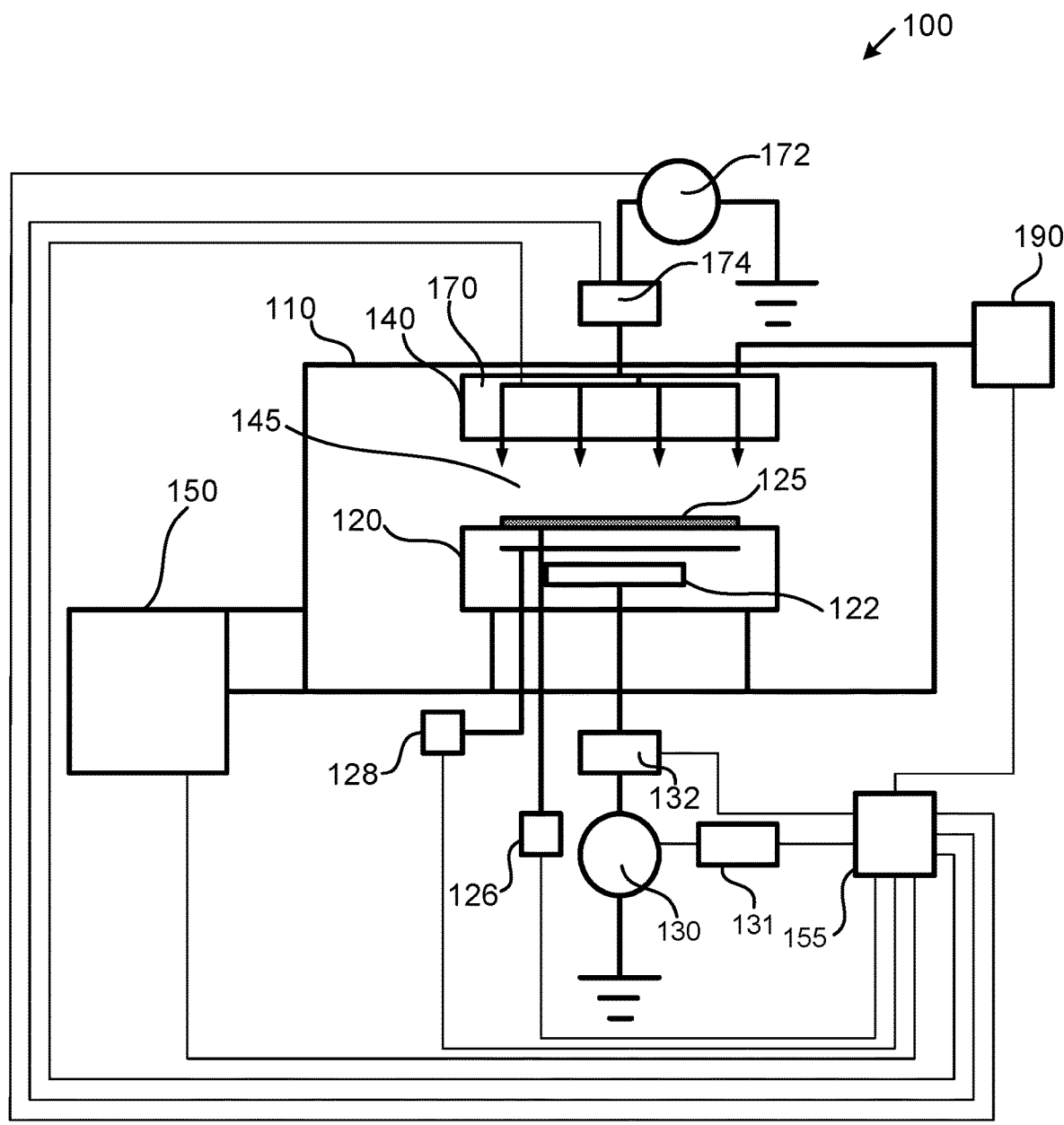
FIG. 1 illustrates one embodiment of a reactive ion etch (RIE) tool for semiconductor processing.

Methods and systems for selective deposition of protective caps for fully-aligned-via formation are described. One embodiment includes forming one or more conductive lines (for example metal lines) in trenches formed in an interlayer dielectrics (ILD) layer, and then forming protective caps (for example Ru caps) over the one or more conductive lines. An etch stop layer (ESL) may then be formed over the Ru caps and the ILD layer for further processing. When the ESL layer is removed at a later processing step, the protective caps prevent damage to the underlying conductive lines because of the high selectivity of the protective cap material (e.g., Ru) with respect to the ESL material (e.g., SiCN, SiC, AlO, AlN, etc.). The protective cap material may be left in line with the conductive lines because of the high degree of conductivity of the selected cap material (e.g., Ru).

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Embodiments of the disclosed system and method may be used to etch silicon cyanide (SiCN) with non-corrosive chemistry (such as nitrogen trifluoride) selectively to other materials in a multi-color test vehicle in a plasma etch tool. High selectivity to materials such as silicon, silicon oxide, silicon nitride and silicon oxycarbide is achieved and it was shown it is an isotropic etch process.

Referring now to the drawings, where like reference numerals designate identical or corresponding parts throughout the several views.

FIG. 1 is an embodiment of a system 100 for selective deposition of ruthenium caps for fully-aligned-via formation. In a further embodiment, the system 100 may be configured for selective deposition of ruthenium caps for fully-aligned-via formation as described with reference to FIG. 2 and the examples of FIGS. 3A-4G. An etch and plasma-assisted deposition system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

One of ordinary skill will recognize that ranges of parameters may be used, and that various parameter levels may be optimal for various applications of the described embodiments. Variables may include material compositions, layer thicknesses, etch depths, selectivity requirements, etc.

Figure 2:
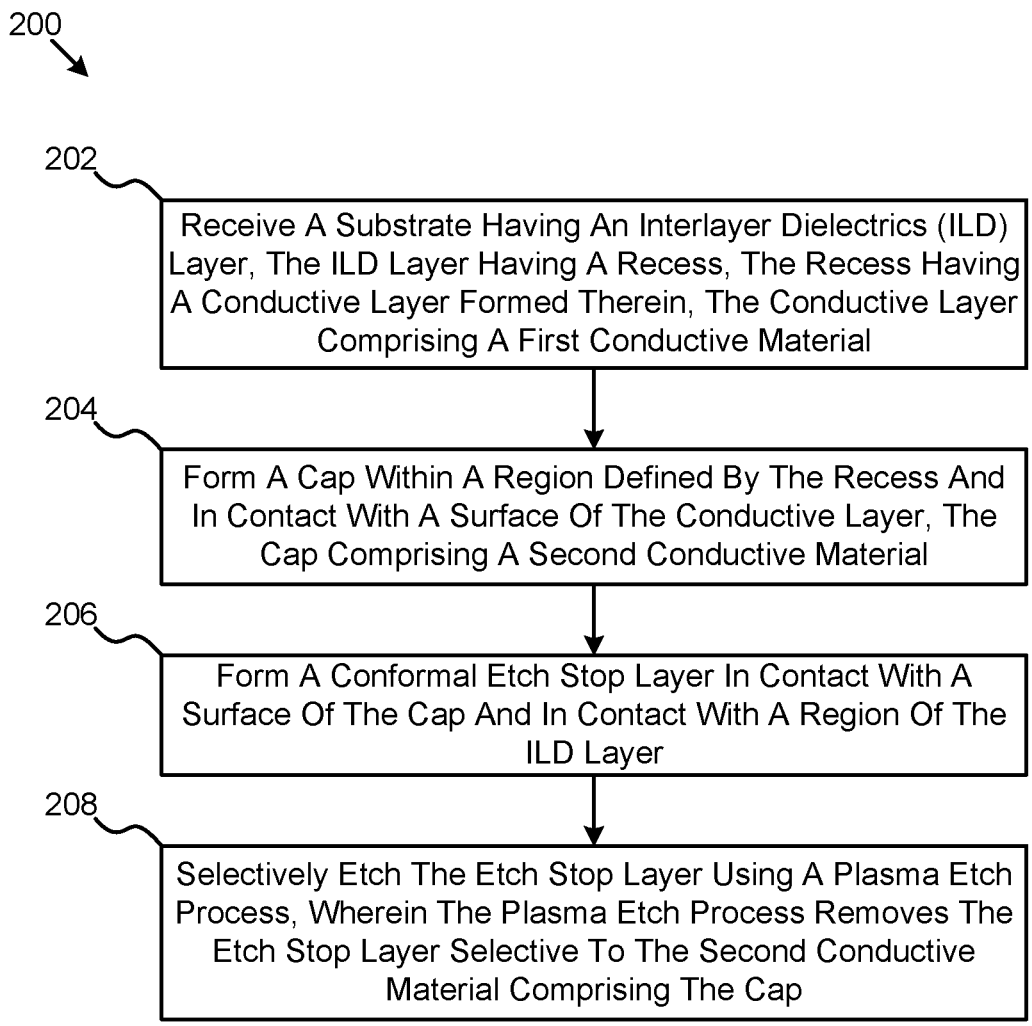
FIG. 2 illustrates one embodiment of a method for selective deposition of a conductive cap for FAV features.

FIG. 2 illustrates one embodiment of a method 200 for selective deposition of Ru caps for FAV formation. In an embodiment, a method 200 may include receiving a substrate having an interlayer dielectrics (ILD) layer, the ILD layer having a recess, the recess having a conductive layer formed therein, the conductive layer comprising a first conductive material as shown at block 202. At block 204, the method 200 includes forming a cap within a region defined by the recess and in contact with a surface of the conductive layer, the cap comprising a second conductive material. At block 206, the method 200 continues with forming a conformal etch stop layer in contact with a surface of the cap and in contact with a region of the ILD layer. At block 208, the method 200 includes selectively etching the etch stop layer using a plasma etch process, wherein the plasma etch process removes the etch stop layer selective to the second conductive material comprising the cap.

Figure 3A:
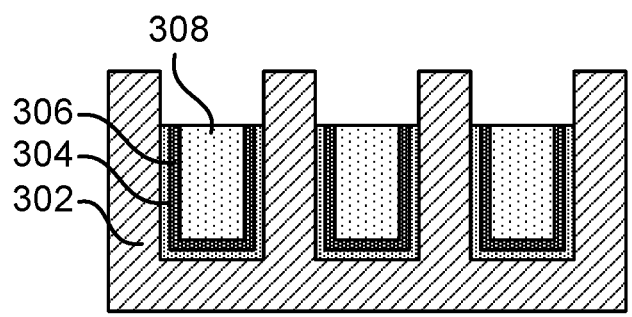
FIG. 3A is a cross-section diagram illustrating one embodiment of a workpiece at an embodiment of a phase of a process for forming FAV features.

FIGS. 3A-3F illustrate processing steps for selective deposition of protective caps for FAV formation. FIG. 3A illustrates an embodiment of a workpiece received in a processing chamber 110, or formed in the processing chamber 110 according to various embodiments. The workpiece may be formed on the wafer 125. In an embodiment, the workpiece includes an ILD layer 302. A recess may be formed in a region of the ILD layer 302. In an embodiment, the recess is lined with a barrier layer 304 and a liner 306. A conductive layer 308 is formed in the recess adjacent the liner 306. In an embodiment, further recesses may be formed in the conductive layer 308 using, for example, CMP, wet etch, or plasma etch processes. In an embodiment, the conductive layer 308 may comprise a conductive material, such as metal. Suitable metals may include gold, copper, aluminum, titanium, or various metal alloys or metal-containing compounds. One of skill in the art may recognize a variety of materials suitable for the conductive layer 308.

Figure 3B:
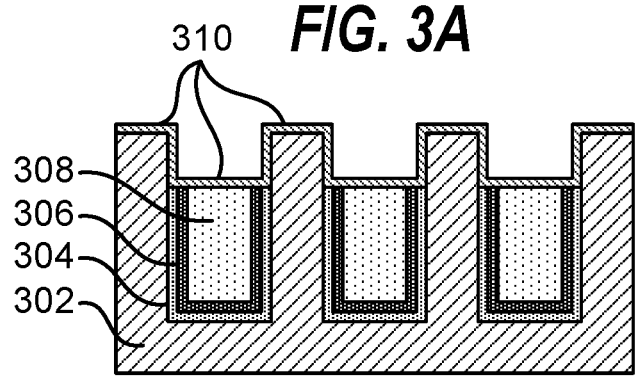
FIG. 3B is a cross-section diagram illustrating one embodiment of a workpiece at an embodiment of a phase of a process for forming FAV features.

FIG. 3B illustrates a workpiece having a conformal etch stop layer 310 formed on a surface thereof. In an embodiment, the etch stop layer 310 conforms to both the surface of the conductive layer 308 and the surface of the ILD 302. In various embodiments, the etch stop layer 310 may comprise SiCN, SiOC, AlO, AlN, or other dielectric materials known to one of skill in the art.

Figure 3C:
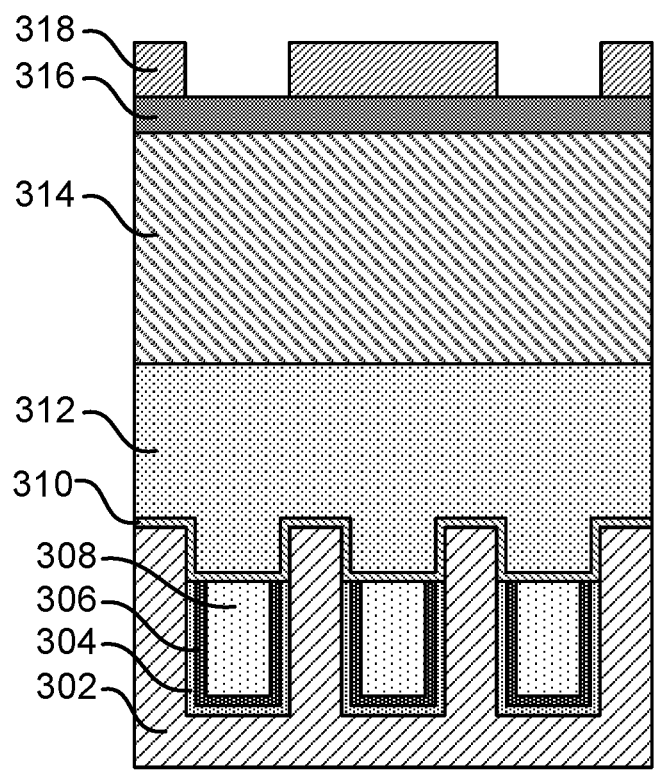
FIG. 3C is a cross-section diagram illustrating one embodiment of a workpiece at an embodiment of a phase of a process for forming FAV features.

FIG. 3C illustrates an embodiment where a plurality of additional layers are formed above the etch stop layer 310. In an embodiment, a low-k layer 312 may be formed on the etch stop layer 310. In various embodiments a quad stack or tri-layer structure may be formed over the low-k layer 312. In the embodiment depicted in FIG. 3C, a tri-layer stack comprising an organic polymer layer (OPL) 314, a Si-ARC layer 316 and a photoresist layer 318 are formed over the low-k layer 312. In an embodiment, the photoresist layer 318 may be patterned using one or more lithography processes. One of ordinary skill will recognize a variety of optional structures which may be incorporated in accordance with the present embodiments.

Figure 3D:
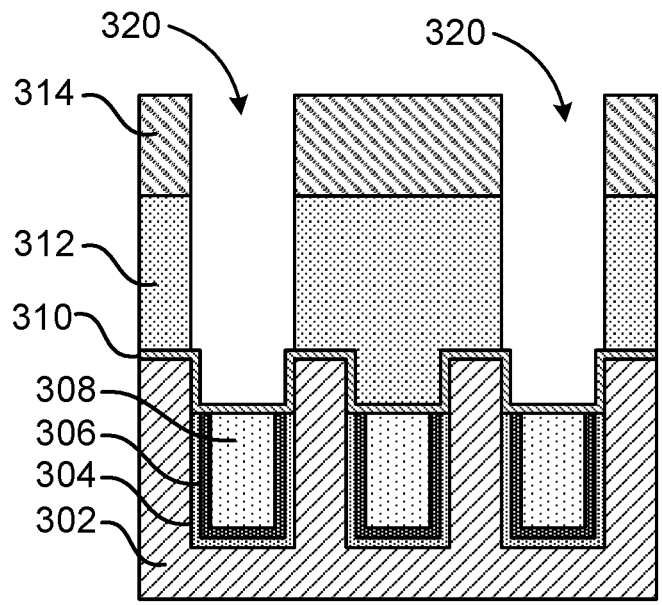
FIG. 3D is a cross-section diagram illustrating one embodiment of a workpiece at an embodiment of a phase of a process for forming FAV features.

FIG. 3D illustrates a result of an etch process where trenches 320 are formed down to the etch stop layer 310. The trenches 320 may have various physical configurations and dimensions depending upon the via requirements. The etch stop layer 310 may comprise material that is selective to the high-k material or other over burden layers. The etch stop layer 310 may act as a barrier limiting the depth of etch and protecting underlying components. The via etch process for forming the trenches 320 may be performed using a deep reactive ion etch (DRIE) process, or the like.

Figure 3E:
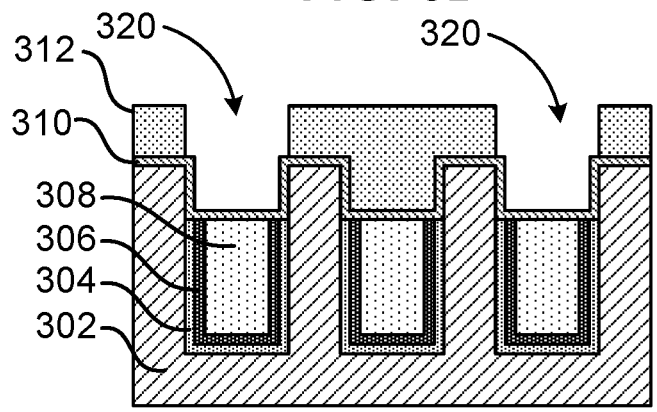
FIG. 3E is a cross-section diagram illustrating one embodiment of a workpiece at an embodiment of a phase of a process for forming FAV features.

FIG. 3E illustrates a result of an OPL removal process. In an embodiment, the process includes removing any remaining photoresist 318, remaining SiARC layer 316, and remaining OPL layer 314. In such a process, a portion of the high-k layer 312 may also be removed, but at least a portion of the high-k layer may remain to protect certain components not accessed by the vias. The OPL removal may be performed using CMP, wet etch, or other suitable processes. In such an embodiment, the etch stop layer 310 may help to keep higher via and chamfer angles in the workpiece during this step.

Figure 3F:
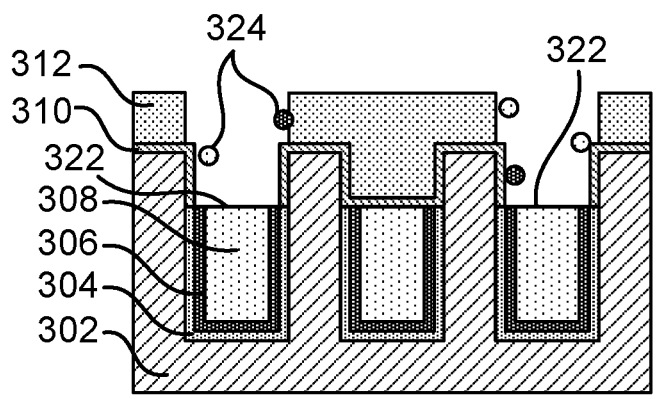
FIG. 3F is a cross-section diagram illustrating one embodiment of a workpiece at an embodiment of a phase of a process for forming FAV features.

A portion of the etch stop layer 310 covering the conductive layer 308 needs to be removed for via contact because the etch stop layer 310 comprises a dielectric material. FIG. 3F illustrates a result of a process for removing a portion of the etch stop layer 310. In an embodiment a plasma etch process is used to remove the etch stop layer 310. The plasma etch process may use a chemistry that is selective to the high-k material. As the etch stop layer 310 is removed, portions of the etch stop layer 310 and portions of the underlying conductive layer 308 may be removed simultaneously. Inadvertent removal of the conductive layer material is undesirable and creates processing contamination and damages the conductive layer 308. Contaminants 324 may form on side walls of the trench 320.

The residue in the via trench 320 cause voids in the via bottom and side wall after the later metal filling steps, especially when via CD is small. The contamination is very problematic for BEOL advanced nodes with the FAV flow. The residue on the chamber wall also contaminate the chamber 110 and degrade the productivity and reliability of chamber due to etch rate shift.

Figure 4A:
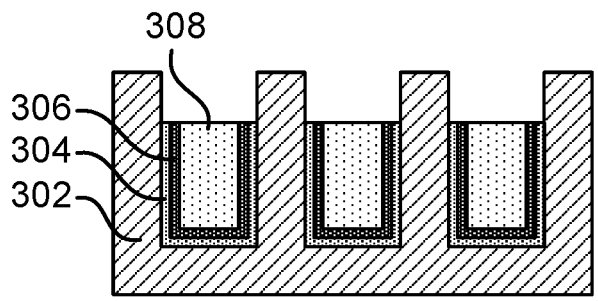
FIG. 4A is a cross-section diagram illustrating one embodiment of a workpiece at an embodiment of a phase of a process for selective deposition of conductive a cap for FAV features.
Figure 4B:
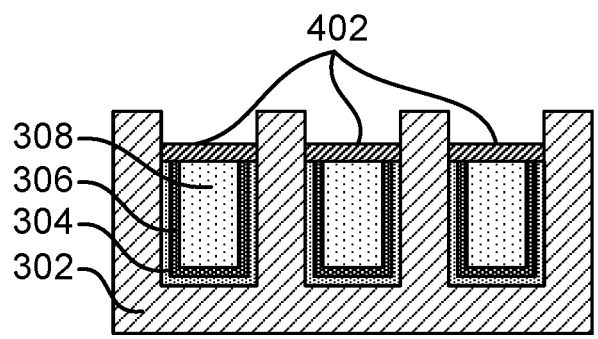
FIG. 4B is a cross-section diagram illustrating one embodiment of a workpiece at an embodiment of a phase of a process for selective deposition of conductive a cap for FAV features.

FIGS. 4A-4G illustrate an improved process for selective deposition of Ru caps for FAV formation. In FIG. 4A a workpiece is received that is similar to the workpiece of FIG. 3A. FIG. 4B illustrates a result of a conductive cap deposition process. In an embodiment, the conductive cap 402 is formed in a recess over the regions defining the conductive layer 308. In an embodiment, the conductive cap 402 comprises ruthenium (Ru). In certain embodiments, Ru may be used for the conductive cap 402 because plasma etch chemistries used for etch stop removal processes may be selected to be highly selective to Ru or Ru-containing materials. Thus, the Ru cap may provide an effective barrier to damage or contamination during the etch stop removal process illustrated in FIG. 4G.

Figure 4C:
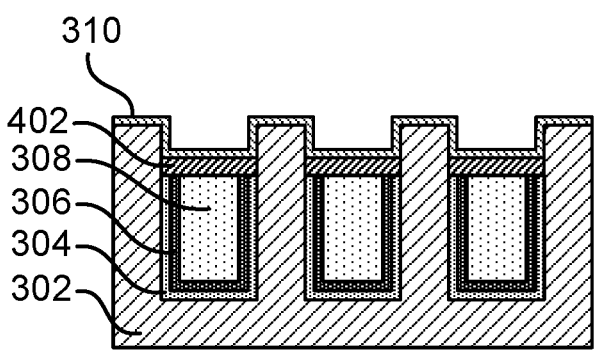
FIG. 4C is a cross-section diagram illustrating one embodiment of a workpiece at an embodiment of a phase of a process for selective deposition of conductive a cap for FAV features.

FIG. 4C illustrates a result of a process for depositing an etch stop layer 310. The etch stop layer 310 may be deposited using CVD or other techniques for depositing conformal thin film layers. The etch stop layer 310 may be deposited over regions defining the conductive cap 402 and regions defining ILD layer 302.

Figure 4D:
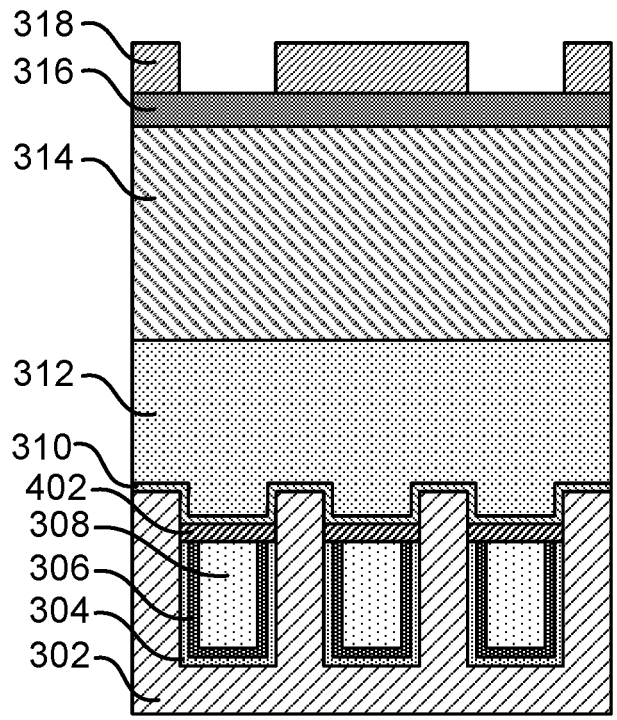
FIG. 4D is a cross-section diagram illustrating one embodiment of a workpiece at an embodiment of a phase of a process for selective deposition of conductive a cap for FAV features.
Figure 4E:
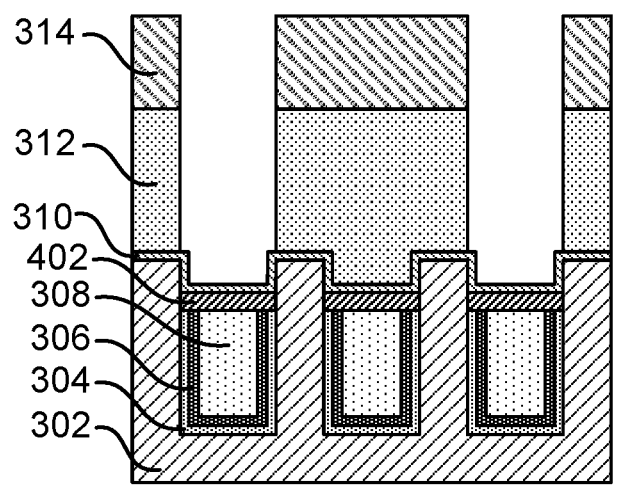
FIG. 4E is a cross-section diagram illustrating one embodiment of a workpiece at an embodiment of a phase of a process for selective deposition of conductive a cap for FAV features.
Figure 4F:
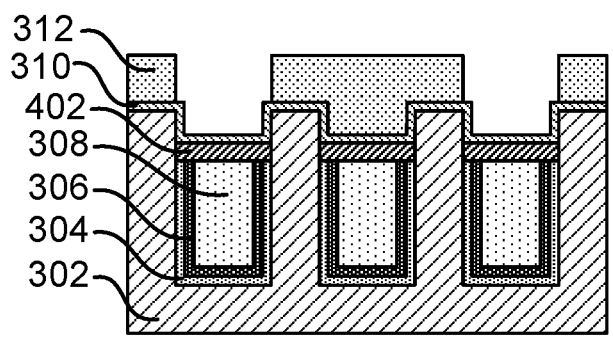
FIG. 4F is a cross-section diagram illustrating one embodiment of a workpiece at an embodiment of a phase of a process for selective deposition of conductive a cap for FAV features.

FIG. 4D illustrates a result of a process for building up a lithography stack comprising a high-k layer 312, an OPL 314, a SiARC layer 316, and a patterned photoresist layer 318. FIG. 4E illustrates a result of a process for etching trenches or recesses in the OPL 314 and the high-k layer 312 according to a pattern defined by the patterned photoresist layer 318. FIG. 4F illustrates a result of a process for removing the OPL 314 layer and a portion of the high-k layer 312.

Figure 4G:
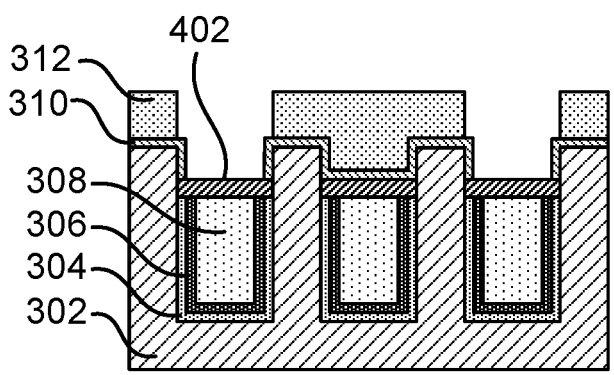
FIG. 4G is a cross-section diagram illustrating one embodiment of a workpiece at an embodiment of a phase of a process for selective deposition of conductive a cap for FAV features.

FIG. 4G illustrates a result of a process for removing the etch stop layer 310 according to the improved process described herein. In an embodiment, the etch stop layer 310 is removed using a plasma etch process with an etch reaction chemistry that is selective to Ru. Thus, the etch stop layer 310 is removed without the same degree of contamination, and the underlying conductive layer 308 is protected by the conductive cap 402. This process improves device yield rates and maintains critical dimensions and other parameter requirements due to the lack of contamination and damage to device structures. In a further embodiment, a conductive via is formed in contact with the conductive cap 402 in a region exposed by removal of the etch stop layer 310.

In one embodiment, the selective etch process is performed using a reactive ion etch (RIE) technique. An embodiment of a system that may be used for performing the selective etch process is illustrated in FIG. 1. The selective etch process may be carried out using one or more etch gas constituents that selectively etches the etch stop layer material, but not the Ru cap material. In one embodiment, the selective etch gas comprises one or more of CF4, CHF3, CH2F2, CH3F, CH4, C4F6, C4F8, and BCl3. In one embodiment, the etch gas may be introduced to the processing chamber at a flow rate in a range of 0-100 sccm for each gas.

In an embodiment, temperature, pressure, RF power, and processing time may be further controlled to meet processing objectives. In one embodiment, an etch chamber pressure is in a range of 10-100 mTorr. In an embodiment, a high frequency power may be applied in the chamber at a power level in a range of 0-1200 W. A low frequency power may be applied in the chamber at a power level in a range of 0-1200 W. The processing time may be in a range of 3-120 second. In addition, the chamber temperature may be in a range of 20–60° C.

Although specific ranges of processing parameters have been described herein, one of ordinary skill will recognize that alternative ranges of processing parameters may be used without departure from the scope of the present invention, and that the processing parameters may be variable according to the selected materials, required degree of selectivity, CD of the etched components, depth of etch, and the like. The present embodiments may improve metallization in small feature and minimize metal contamination in the chamber since there is no metal residues coming out from metal interconnects during plasma etching.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for processing a substrate, comprising:
   receiving a substrate having an interlayer dielectrics (ILD) layer, the ILD layer having a recess comprising a first conductive material;
   forming a cap within a region defined by the recess and in contact with a surface of the first conductive material, the cap comprising a second conductive material, the first conductive material and the cap in combination partially filling the recess;
   forming a conformal etch stop layer in contact with a surface of the cap and in contact with a region of the ILD layer; and
   selectively etching the etch stop layer using a plasma etch process, wherein the plasma etch process removes the etch stop layer selective to the second conductive material comprising the cap.

2. The method of claim 1, wherein the second conductive material comprises ruthenium (Ru).

3. The method of claim 1, wherein the cap is formed to a thickness in a range of 5-10 nm.

4. The method of claim 1, wherein the etch stop layer comprises a dielectric material.

5. The method of claim 4, wherein the dielectric material comprises SiCN, SiOC, AlO, or AlN.

6. The method of claim 1, wherein the plasma etch process comprises filling a plasma etch chamber with a mixture of etch gasses comprising one or more of $CF_4$, $CHF_3$, $CH_2F_2$, $CH_3F$, $CH_4$, $C_4F_6$, $C_4F_8$, and $BCl_3$.

7. The method of claim 6, wherein the etch gas is provided to the plasma etch chamber at a flow rate in a range of 0-100 sccm for each gas, wherein the plasma etch chamber is operated at a pressure in a range of 10-100 mTorr, wherein the plasma etch chamber is operated at a temperature in a range of 20-60° C., wherein the plasma etch chamber is operated at a high frequency power level in a range of 0-1200 W, and wherein the plasma etch chamber is operated at a low frequency power level in a range of 0-1200 W.

8. The method of claim 1, further comprising forming a plurality of layers on the etch stop layer.

9. The method of claim 8, wherein the plurality of layers comprises at least one patterned layer, the patterned layer defining a region for forming a via to contact the cap.

10. The method of claim 9, wherein the plurality of layers is etched to expose the etch stop layer in the region defined by the patterned layer.

11. The method of claim 10, further comprising forming a conductive via structure in contact with the cap.

12. The method of claim 1, wherein the substrate further comprising a barrier layer and a liner layer, the barrier layer disposed between the ILD layer and the liner layer, the liner layer disposed between the barrier layer and the first conductive material.

13. The method of claim 1, wherein the first conductive material comprises gold, copper, aluminum, or titanium.

14. A method of processing a substrate, the method comprising:
   forming a recess in an interlayer dielectrics (ILD) layer over the substrate, the recess having a first height from a bottom surface of the recess to a top surface of the ILD layer;
   filling the recess to form a conductive line having a second height less than the first height, the conductive line comprising a barrier layer and a liner layer conformally lining sidewalls of the recess up to the second height and a first conductive material formed over the liner layer;
   selectively depositing a second conductive material over the barrier layer, the liner layer, and the first conductive material to form a cap over the conductive line within the recess, the cap covering the barrier layer, the liner layer, the first conductive material, and a first portion of the sidewalls of the recess, a second portion of the sidewalls between the top surface of the ILD layer and a top surface of the cap being exposed after selectively depositing the second conductive material; and
   forming an etch stop layer over the top surface of the cap, over the second portion of the sidewalls, and over the top surface of the ILD layer.

15. The method of claim 14, wherein the first conductive material comprises gold, copper, aluminum, or titanium, and wherein the second conductive material comprises ruthenium (Ru).

16. The method of claim 14, further comprising, after forming the etch stop layer:
   forming a plurality of layers over the etch stop layer;
   patterning the plurality of layers to expose the etch stop layer, the etch stop layer protecting the top surface of the cap and the ILD layer during the patterning;
   selectively and anisotropically etching the etch stop layer using a selective plasma etch process to expose the cap, the selective plasma etch process removing the etch stop layer selective to the second conductive material and retaining the etch stop layer over the second portion of the sidewalls; and forming a conductive interconnect structure in contact with the cap.

17. The method of claim 16, wherein the etch stop comprises SiCN, and wherein the selective plasma etch process comprises filling a plasma etch chamber with a etch gas comprising nitrogen trifluoride ($NF_3$).

18. A method of processing a substrate, the method comprising:

forming a recess in an interlayer dielectrics (ILD) layer;

partially filling the recess by depositing a first conductive material over the substrate, the first conductive material comprising gold, copper, aluminum, or titanium;

selectively depositing a second conductive material over the first conductive material to form a cap, the second conductive material being different from the first conductive material, the cap and the first conductive material partially filling the recess to leave a portion of the sidewalls of the ILD layer exposed;

forming a conformal etch stop layer in contact with a surface of the cap and in contact with a region of the ILD layer, the region comprising a top surface of the ILD layer and the portion of the sidewalls of the ILD layer;

forming a low-k dielectric layer over the etch stop layer;

etching the low-k dielectric layer to expose a portion of the etch stop layer, the etch stop layer protecting the cap and the region of the ILD layer from being etched; and selectively etching the exposed portion of the etch stop layer using a plasma etch process, wherein the plasma etch process removes the exposed portion of the etch stop layer selective to the second conductive material.

19. The method of claim 18, wherein the second conductive material comprises ruthenium (Ru).

20. The method of claim 18, wherein the cap has a first thickness and the etch stop layer has a second thickness, the first thickness being greater than the second thickness.

* * * * *